United States Patent
Hargreaves et al.

(10) Patent No.: US 7,301,341 B2
(45) Date of Patent: Nov. 27, 2007

(54) MRI GRADIENT WAVEFORM DESIGN USING CONVEX OPTIMIZATION

(75) Inventors: Brian A. Hargreaves, Menlo Park, CA (US); Steven M. Conolly, Palo Alto, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 852 days.

(21) Appl. No.: 10/682,637

(22) Filed: Oct. 8, 2003

(65) Prior Publication Data

US 2005/0077895 A1    Apr. 14, 2005

(51) Int. Cl.
    *G01V 3/00*    (2006.01)
(52) U.S. Cl. .................................... 324/307
(58) Field of Classification Search ........ 324/300–322; 702/124, 179, 189; 382/131, 320
    See application file for complete search history.

(56) References Cited

U.S. PATENT DOCUMENTS

| | | | | |
|---|---|---|---|---|
| 4,663,591 A | * | 5/1987 | Pelc et al. | 324/309 |
| 4,706,026 A | * | 11/1987 | Pelc et al. | 324/309 |
| 5,402,067 A | | 3/1995 | Pauly et al. | 324/307 |
| 5,486,762 A | * | 1/1996 | Freedman et al. | 324/303 |
| 5,512,825 A | | 4/1996 | Atalar et al. | 324/309 |
| 5,539,313 A | | 7/1996 | Meyer | 324/309 |
| 5,770,943 A | * | 6/1998 | Zhou | 324/307 |
| 6,020,739 A | | 2/2000 | Meyer et al. | 324/309 |
| 6,067,001 A | | 5/2000 | Xu et al. | 335/299 |
| 6,075,365 A | | 6/2000 | Conolly | 324/320 |
| 6,188,219 B1 | * | 2/2001 | Reeder et al. | 324/307 |
| 6,198,282 B1 | * | 3/2001 | Dumoulin | 324/307 |
| 6,255,929 B1 | | 7/2001 | Xu et al. | 335/299 |

OTHER PUBLICATIONS

Hargreaves et al., "Time-Optimal Multidimensional Gradient Waveform Design for Rapid Imaging," (2004), Magnetic Resonance in Medicine 51, pp. 81-92.
Simonetti et al., "MRI Gradient Waveform Design by Numerical Optimization," (1993), MRM 29, pp. 498-504.
Simonetti et al., "An Optical Design Method for Magnetic Resonance Imaging Gradient Waveforms," (Jun. 1993), IEEE Transactions on Medical Imaging, vol. 12, No. 2, pp. 350-360.
King et al., "Optimized Gradient Waveforms for Spiral Scanning," Magn Reson Med 1995; 34:156-160.
Xu et al., "Homogeneous Magnet Design Using Linear Programming," IEEE Transactions on Magnetics, 2000; 36:476-483.
Lobo et al., "Applications of Second-Order Cone Programming," Linear Algebra Appl., 1998; 284:193-228.

* cited by examiner

*Primary Examiner*—Brij Shrivastav
*Assistant Examiner*—Dixomara Vargas
(74) *Attorney, Agent, or Firm*—Beyer Weaver LLP

(57) ABSTRACT

A time-optimal MRI gradient design method utilizes constrained optimization to design minimum-time gradient waveforms that satisfy gradient amplitude and slew-rate limitations. Constraints are expressed as linear equations which are solved using linear programming, L1-norm formulation, or second-order cone programming (SOCP).

25 Claims, 13 Drawing Sheets

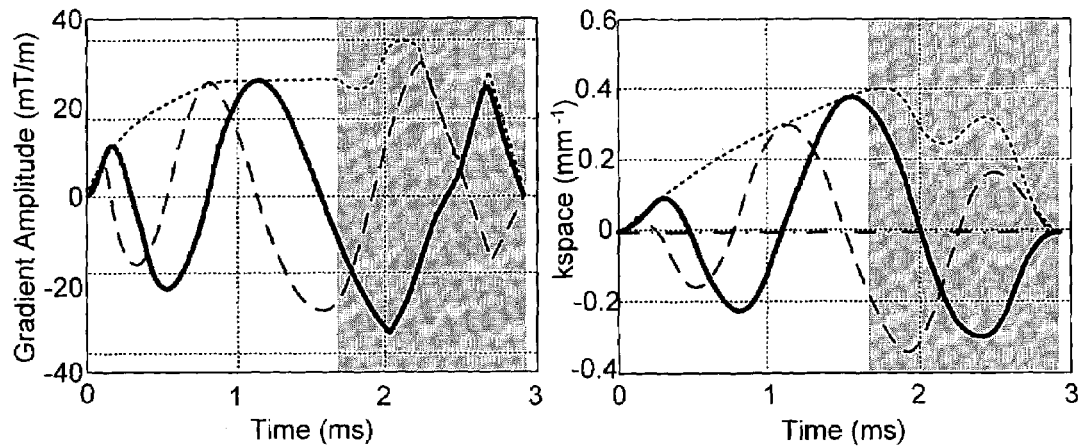
FIG. 9A  FIG. 9B
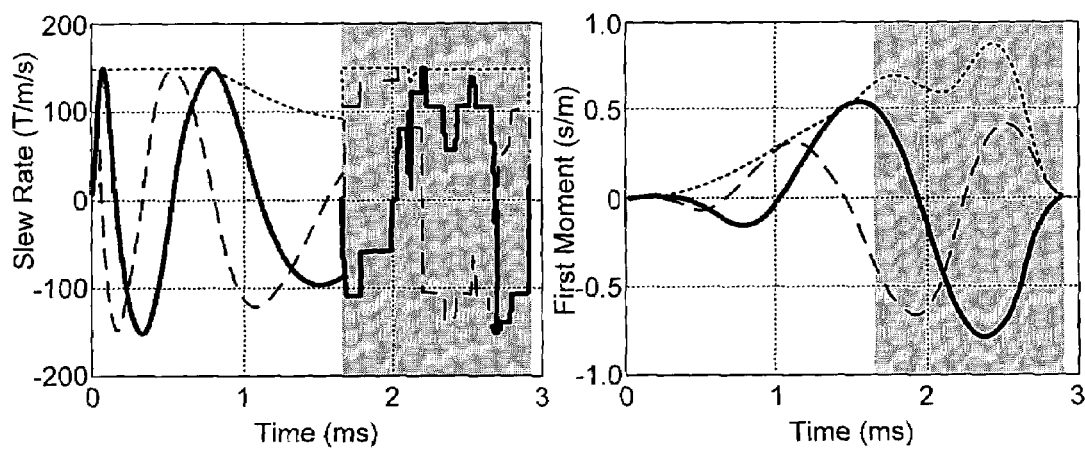
FIG. 9C  FIG. 9D

MRI GRADIENT WAVEFORM DESIGN USING CONVEX OPTIMIZATION

STATEMENT AS TO RIGHTS TO INVENTIONS MADE UNDER FEDERALLY SPONSORED RESEARCH OR DEVELOPMENT

The U.S. Government has rights in the disclosed invention pursuant to NIH Grant Nos. NIH-HL39297, NIH-HL56394, NIH-AR46904 and NIH-CA50948 to Stanford University.

BACKGROUND OF THE INVENTION

This invention relates generally to magnetic resonance imaging (MRI), and more particularly, the invention relates to the design of magnetic gradients for use in MRI.

Magnetic resonance imaging (MRI) requires placing an object to be imaged in a static magnetic field, exciting nuclear spins in the object within the magnetic field, and then detecting signals emitted by the excited spins as they precess within the magnetic field. Through use of magnetic gradient and phase encoding of the excited magnetization, detected signals can be spatially localized in three dimensions.

Advances in MR system hardware enable the use of new rapid pulse sequences. Typical rapid sequences include rapid gradient-echo (FLASH, GRASS) and multi-echo spin-echo (TSE, FSE, RARE) sequences. Refocused SSFP (True-FISP, FIESTA, balanced-FFE) sequences, which produce high signal and contrast, are becoming common as improved gradients allow imaging with minimal artifacts from off-resonance. All of these sequences demand efficient gradient waveform design. Efficient acquisition methods include echo-planar and spiral imaging. Aside from imaging trajectories, gradient waveform design includes phase-encoding, prewinder and rewinder gradients. In rapid sequences with short repetition times, the design of these latter gradients is an important consideration in improving imaging efficiency, because their duration reduces the image acquisition duty cycle.

In particular, the design problem is to minimize gradient waveform durations subject to both hardware constraints and sequence constraints such as desired gradient area. Numerous previous works have presented different methods to optimize gradients in different situations. Many of these methods are limited to the design of trapezoidal pulses, and most have been demonstrated for 1D gradient design. Simonetti et al. presented a general technique to minimize 1D-gradient properties such as moments, diffusion-sensitivity 2 or RMS-current of 1D gradients using numerical optimization. See "An Optimal Design Method for Magnetic Resonance Imaging Gradient Waveforms," IEEE Trans Med Imaging 1993; 12:350-360; and "MRI Gradient Waveform Design by Numerical Optimization," Magn Reson Med 1993; 29: 498-504.

BRIEF SUMMARY OF THE INVENTION

The design of rapid imaging sequences requires time-optimal magnetic gradient waveforms to provide maximum spatial resolution while keeping both repetition times and scan times low. In accordance with the invention, constrained optimization is used in designing gradients that satisfy gradient-amplitude and slew-rate limitations and additional constraints such as beginning and end amplitude, gradient area and higher-order gradient moments.

The design is formulated as linear equations for a number, N, of discrete-time waveforms with a sampling period $\tau$. A minimum time gradient requires the identification of the smallest value for N for which a design solution exists. A binary search technique is employed to minimize the time in identifying the minimum value of $N\tau$ which provides a solution.

The linear equations are then solved using known linear programming, L1-norm formulation, or second-order cone programming (SOCP).

The design can also include constraints on the gradient waveform to avoid overheating and to limit maximum stimulation thresholds in the waveform algorithm. It is known that the gradient amplifier, wires, and coils have several heating constraints. Also, the time varying magnetic field of a gradient amplifier can induce electric fields of sufficient magnitude to excite nerves. These constraints can be addressed in the gradient waveform design.

The invention and objects and features thereof will be more readily apparent from the following detailed description and appended claims when taken with the drawings.

BRIEF DESCRIPTION OF THE DRAWINGS

FIGS. 9a-9d illustrate moment-nulled spiral rewinder gradient design.

DETAILED DESCRIPTION OF ILLUSTRATIVE EMBODIMENTS

The design method can be used in accordance with the invention to design minimum-time gradient waveforms that satisfy gradient-amplitude and slew-rate limitations. Additional constraints such as gradient start and end amplitudes, gradient area or higher-order gradient moments can be included. Importantly, application of the method can be extended to multi-dimensional gradient design which is necessary for procedures that use oblique scan-plane orientations.

Consider first the general constraints in gradient waveform design including gradient amplifier voltage and current limits as well as pulse-sequence requirements. Next, methods of formulating the problem are described so that it can be solved using three different types of existing linear and quadratic programming techniques. All of these techniques result in comparable solutions.

A gradient amplifier supplies current to a gradient coil, producing a continuously-varying gradient, G(t). The amplifier has current and voltage limits ($I_{max}$ and $V_{max}$) that result in the following limits on G(t) as described in King et al., "Optimized Waveforms for Spiral Scanning," Magn Reson Med 1995; 34:156-160.

$$|G(t)| \le \eta I_{max} \quad (1)$$

and $$\left| L\frac{d}{dt}G(t) + RG(t) \right| \le \eta V_{max}. \quad (2)$$

Here L, R and η are the gradient coil inductance, resistance and efficiency (i.e., in mT/m/A). In MRI systems, the gradient can be considered a vector, $\vec{G}(t)$ that is composed of three components, $G_x(t)$, $G_y(t)$, and $G_z(t)$. The primary purpose of the invention is to specify gradient waveforms that can be freely rotated in three dimensions. This constrains the maximum gradient or change of gradient in any direction, and the constraints of Eqs. 1 and 2 become (with $G_{max}=\eta I_{max}$)

$$\|\vec{G}(T)\|_2 \le \eta G_{max} \quad (3)$$

and $$\left\| L\frac{d}{dt}G(t) + R\vec{G}(t) \right\|_2 \le \eta V_{max}. \quad (4)$$

Figure 1:
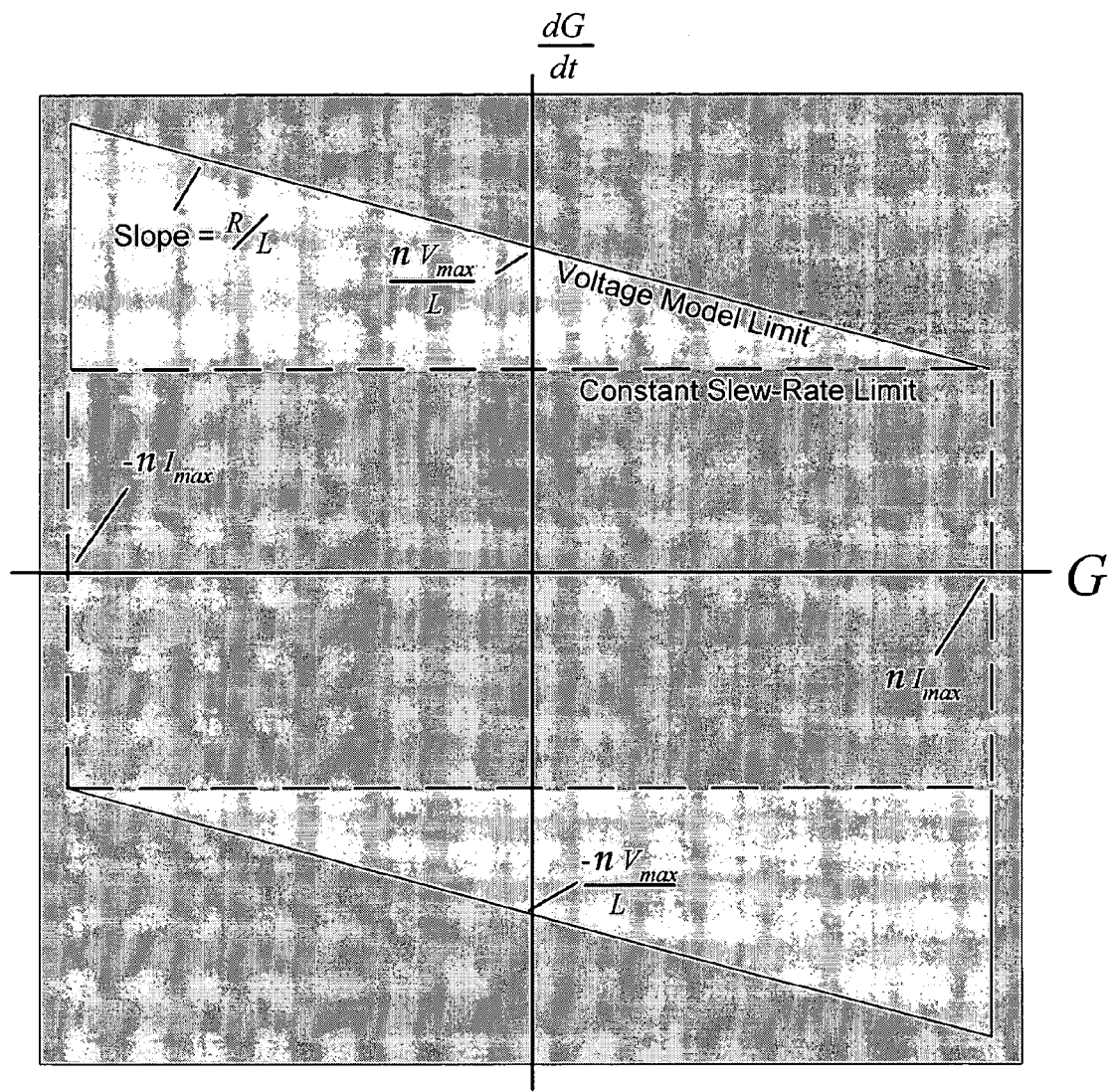
FIG. 1 illustrates a voltage model and a constant-slew-rate-limit model.

Frequently, a simpler "constant-slew-rate-limit" model is used, where $\eta RI_{max}$ is subtracted from the right side of Eqs. 2 and 4 and the RG(t) or $R\vec{G}(t)$ term is omitted. For a single gradient axis, the constraints of the voltage model and the constant-slew-rate-limit model are shown in FIG. 1 which illustrates limits on gradient amplitude and slew-rate for a single-axis gradient due to maximum current ($I_{max}$) and maximum voltage ($V_{max}$). Limits are shown using the common constant-slew-rate-limit model (white area) and the more accurate voltage-limit model (white plus light gray areas). As the ratio of coil resistance (R) to coil inductance (L) increases, the constant-slew-rate-model becomes increasingly constraining, and the voltage-limit model should be used. η is the ratio of gradient strength to gradient current. As the ratio of coil resistance to coil inductance increases, the constant-slew-rate-limit model becomes more constraining.

Imaging requirements of the pulse sequence constrain the k-space change ($\Delta\vec{k}$) that the gradients will produce in terms of the gyromagnetic ratio, γ as $$\int_{t=0}^{T} \vec{G}(t)dt = \frac{2\pi}{\gamma}\Delta\vec{k}. \quad (5)$$

Additionally, there are cases where higher-order moments of the gradients can be specified, as $$\int_{t=0}^{T} t^q\vec{G}(t)dt = \frac{2\pi}{\gamma}\Delta\vec{m}_q \quad (6)$$

where $\Delta\vec{m}_q$ is a specified design constraint on the change in the $q_{th}$ moment of the gradient.

Boundary constraints on the gradient waveforms include having specified initial and final values for the gradient, i.e., $\vec{G}(0)=\vec{g}_0$ and $\vec{G}(T)=\vec{g}_f$. This is required to design gradient waveforms at the start and end of the sequence, and to link different waveforms together.

Figure 2:
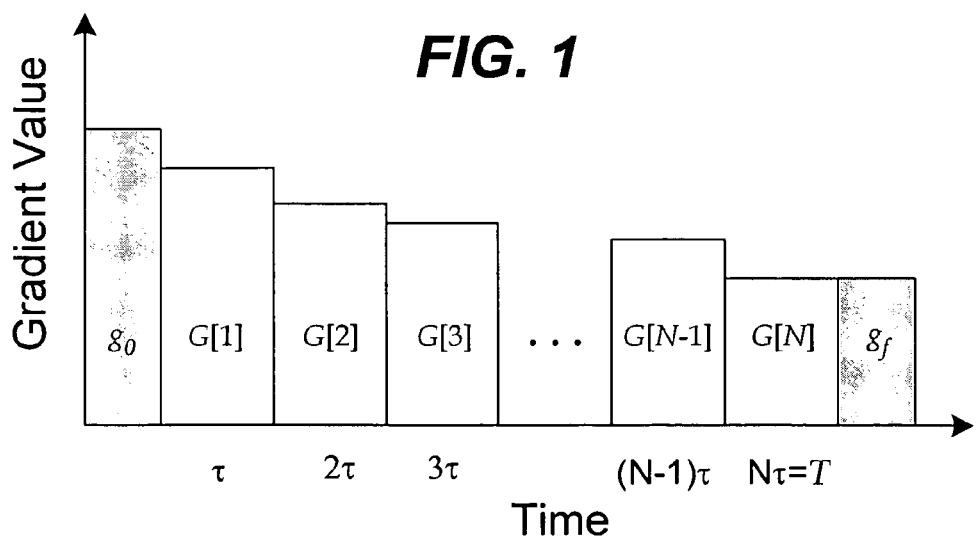
FIG. 2 illustrates discrete approximation of a gradient waveform.

Practical gradients are generated as discrete-time waveforms with a sampling period τ. A gradient waveform can be represented as a discrete sequence $\vec{G}[n]=\vec{G}(n\tau)$ with n=1 . . . N. FIG. 2 shows a single component of the discrete-time vector $\vec{G}[n]$. The constraints in Eqs. 1-6 can easily be converted to discrete-time equivalents, where a derivative is approximated by the slope between two consecutive samples, and an integral is approximated by a discrete sum multiplied by τ. Specifically, it is useful to express the voltage constraint (Eq. 4) as $$\|\alpha\vec{G}[n] + \beta\vec{G}[n+1]\|_2 \le \psi \quad (7)$$

where $\alpha = R - \frac{L}{\tau}, \beta = \frac{L}{\tau}$, and $\psi = \eta V_{max}$ for the voltage model. In the constant-slew-rate-limit model, $$\alpha = -\frac{L}{\tau}, \beta = \frac{L}{\tau}, \text{ and } \psi = \eta V_{max} - RI_{max}.$$

Typically the gradients, as well as the desired moments, consist of two or three separate gradient axes. In basic cases, these axes can be treated separately and all constraints expressed as described in the previous section. However, there are numerous cases where gradients must be designed in a 2D or 3D space that must be free to rotate.

First we now define the solution space consisting of three separate discrete-time waveforms along each axis, $G_x[n]$, $G_y[n]$ and $G_z[n]$, which must collectively satisfy the quadratic constraints of Eqs. 3 and 4. The boundary constraints and moment constraints (Eqs. 5 and 6) are applied separately for each of the dimensions. Overall, the problem is now quadratically constrained.

Before formulating solutions to the gradient design problem, it is useful to summarize the constraints for discrete time waveform design. Table 1 lists the four types of constraint for gradient design problems for D-dimensional, N-point waveform with Q-moments constrained, and the number of instances of each in gradient design. The quadratic inequality constraints are the prime source of complexity in gradient design.

TABLE 1

| Constraint | Type | Number |
|---|---|---|
| Current (Gradient Amplitude) | Quadratic Inequality | N |
| Voltage (Gradient Slew-Rate) | Quadratic Inequality | N |
| Gradient Moments | Linear Equality | D × Q |
| Boundary Values | Linear Equality | 2D |

A certain class of constrained optimization problems, convex-optimization problems, have been studied heretofore. For many types of convex optimization problems, very efficient and robust solution methods have been developed. These methods are guaranteed to find the globally-optimal solution if any solution exists. Following are described methods of expressing the gradient design constraints as standard convex optimization problems so that they may be solved efficiently and reliably.

Both absolute-value and equality constraints can equivalently be expressed as two inequality constraints. A single absolute-value constraint $a|x| \leq b$ can be replaced by two linear constraints, $ax \leq b$ and $-ax \leq b$. An equality constraint of the form $ax = b$ can be replaced by the two inequalities $ax \leq b+\epsilon$ and $-ax \leq -b+\epsilon$. This is desirable in practical optimization, as it allows the tolerance $\epsilon$ to be different for different constraints.

Using this formulation, the constraints of Eqs. 1, 2, 5 and 6 as well as the boundary constraints can all be expressed as linear inequality constraints on the discrete-time gradient waveform.

Each quadratic constraint may be approximated by multiple linear constraints. This is done in 2D, for example, by approximating the circle $G_x[n]^2 + G_y[n]^2 = G_{max}^2$ as a series of P lines defined by $$\cos(\theta_p)G_x[n] + \sin(\theta_p)G_y[n] \leq G_{max}\cos\left(\frac{\pi}{P}\right)_{\forall=1...P} \quad (8)$$

$$\text{where } \theta_p = 2\pi\frac{p-0.5}{P}.$$

Figure 3:
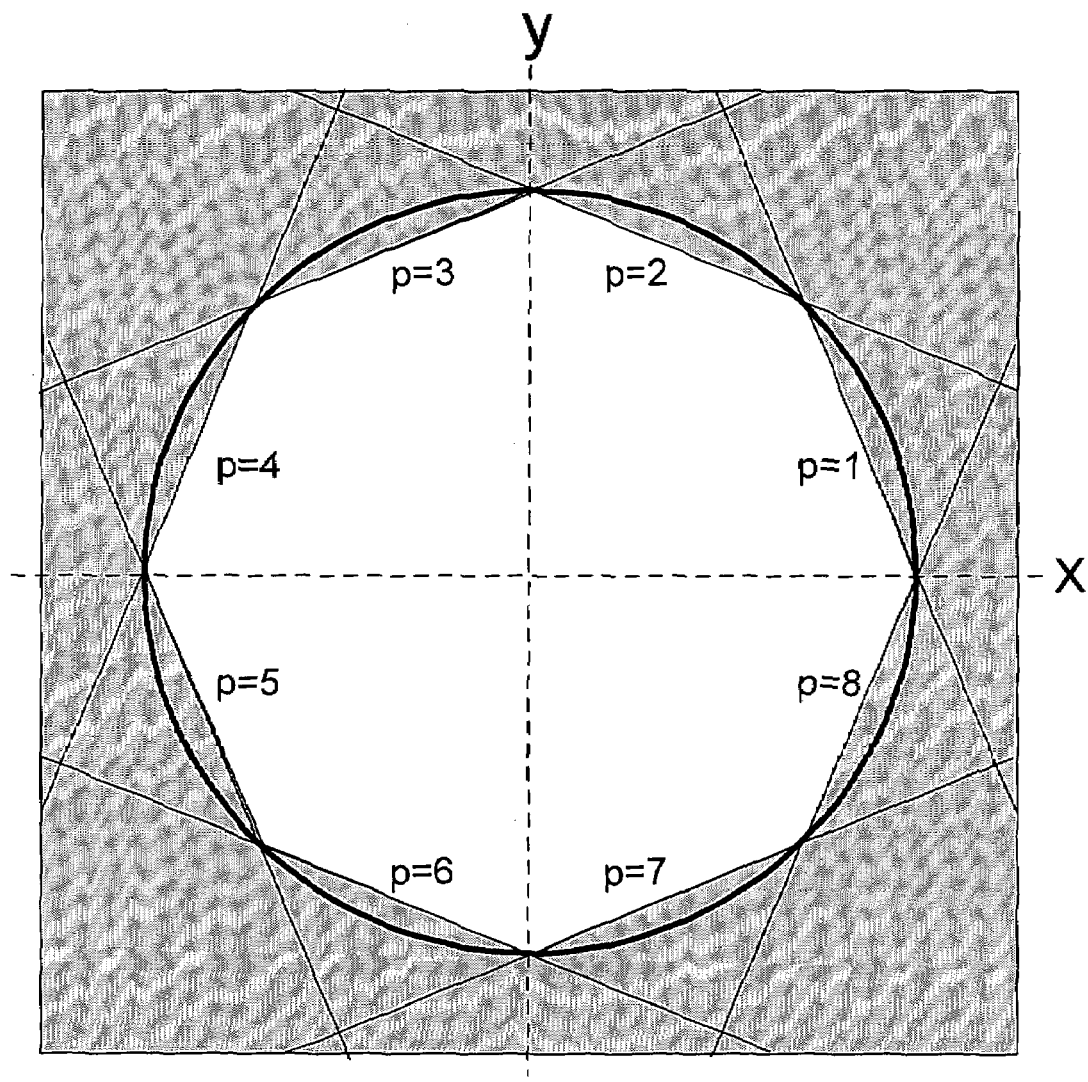
FIG. 3 illustrates piece-wise-linear approximation to quadratic constraints.
Figure 4:
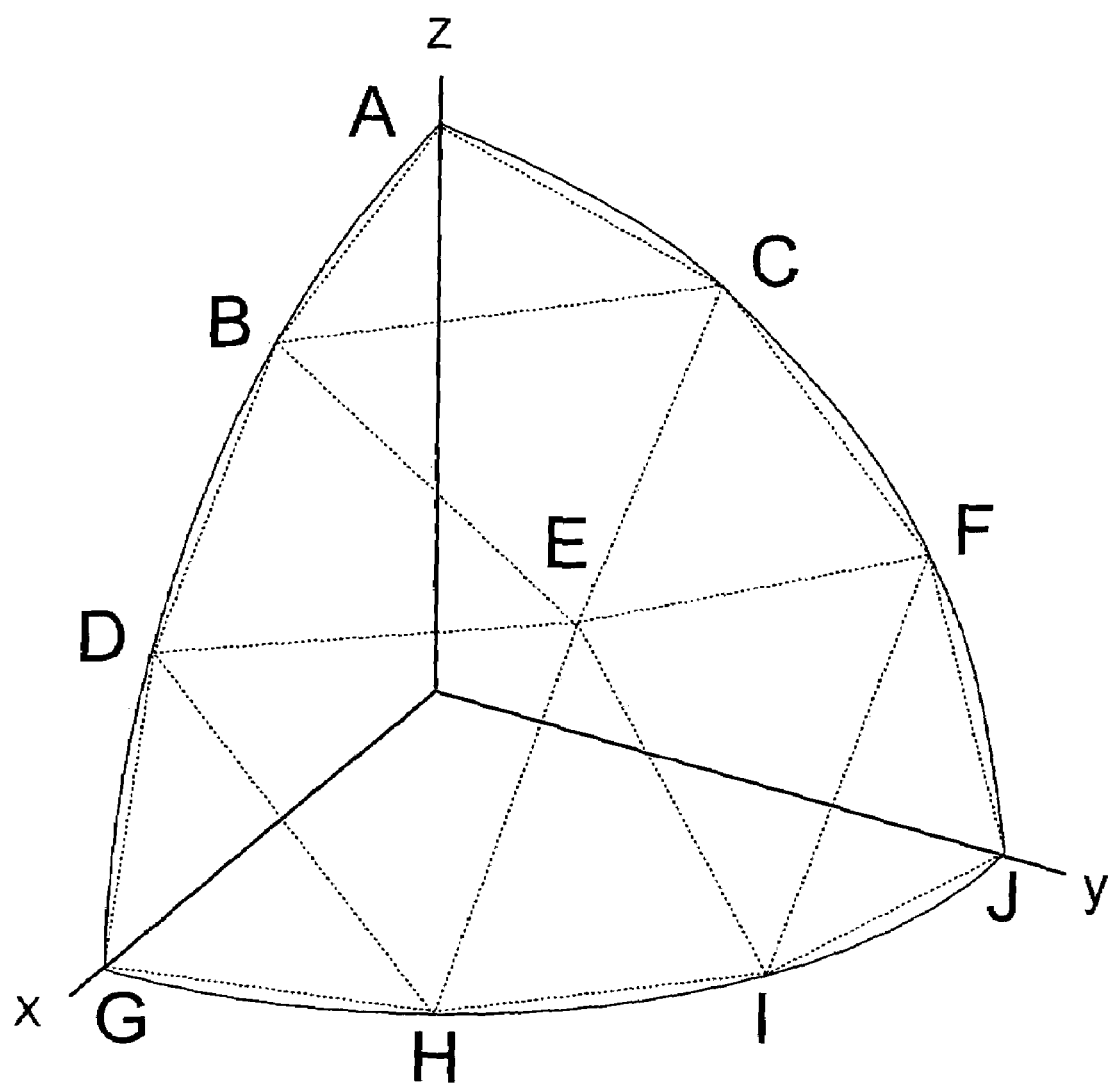
FIG. 4 illustrates piece-wise-linear approximation to a spherical surface.

FIG. 3 shows this piece-wise-linear approximation to a 2D quadratic constraint with P=8. The white area represents allowable values of the 2D amplitude, voltage, or slew-rate. For all of the 2D examples herein, P=16 is used. A piece-wise-linear approximation to a sphere is also possible for 3D quadratically constrained problems. A simple way to do this is to consider the surface of the sphere $|\vec{r}|=c$ in the first octant where the components of $\vec{r}$ are all positive (FIG. 4). By placing points on the surface of the sphere, triangles with roughly equal area are constructed, and the constraints can be expressed in the form $$\vec{n} \cdot \vec{r} \leq \vec{n} \cdot \vec{V} \quad (9)$$

where $\vec{n}$ is a vector normal to the triangle, i.e., $\vec{n} = (\vec{B} - \vec{A}) \times (\vec{C} - \vec{A})$ and $\vec{V}$ is the position vector of any of the triangle corners, ($\vec{A}$, $\vec{B}$, or $\vec{C}$).

For the 3D examples herein, the first quadrant is divided into 9 planes using the points shown in FIG. 4. Here piece-wise-linear approximation to spherical surface represents 3D quadratic constraints. The points shown are permutations of <1,0,0>, $\left\langle \frac{\sqrt{3}}{2}, \frac{1}{2}, 0 \right\rangle$, and $\left\langle \frac{1}{\sqrt{3}}, \frac{1}{\sqrt{3}}, \frac{1}{\sqrt{3}} \right\rangle$.

The entire sphere can then be represented by the 72 planes generated with all permutations of positive and negative signs in the individual $\vec{n}$ vectors.

The problem with only linear inequality constraints can be solved using linear-programming (LP). The "standard LP" form of a problem is to find the vector x that minimizes a cost function $f^T x$ subject to the constraint $Ax \leq b$. The matrix A and vector b are formed by combining all of the linear constraint equations for amplifier and pulse sequence constraints. This formulation of the problem is referred to as "simple-LP" formulation.

The cost function in simple-LP formulation is linear in the gradient values. Minimization of such a cost function is not particularly useful. As such the actual optimization consists of a series of feasibility tests as will be described later. For the simple-LP formulation, f is chosen to be a vector of ones.

The LP formulation for an N-point waveform uses ND variables with roughly $2^{D+1}NP$ constraints, where D is the number of dimensions and P is the number of piece-wise-linear constraints on gradient amplitude and voltage amplitude for which coefficients are all positive (i.e., the number of constraints in the first quadrant or octant). The Appendix shows the complete simple-LP formulation for a 2D freely-rotatable gradient design problem.

An alternative to simple-LP formulation is the L1-norm formulation, which alters the number of constraints and can produce different solutions to the problem, see Xu et al., "Homogeneous Magnet Design Using Linear Programming," IEEE Trans Med Imaging 2000; 36:476-483.

The L1-norm formulation uses standard linear programming to minimize the L1-norm (absolute value) of the gradient and slew voltage by adding "slack variables" to the optimization problem. In addition to solving for $G_x[n]$, we solve a set of variables $H_x[n]$, that converge to $|G_x[n]|$ and a set of variables $S_x[n]$ that converge to $|\alpha G_x[n] + \beta G_x[n+1]|$.

The slack variables are forced to converge by first adding the following linear gradient constraints to the problem:

$-H_x[n] + G_x[n] \leq 0$ $-H_x[n] - G_x[n] \leq 0 \quad (10).$

Additionally we add the following slew-rate constraints:

$-S_x[n] + \alpha G_x[n] + \beta G_x[n+1] \leq 0$ $-S_x[n] - \alpha G_x[n] - \beta G_x[n+1] \leq 0 \quad (11).$ These constraints will force the $H_x[n]$ and $S_x[n]$ variables to approach the appropriate absolute value when combined with minimization of the following cost function:

$$J(S_x[n], H_x[n]) = \sum_{n=1}^{N} (H_x[n] + S_x[n]). \quad (12)$$

For two and three dimensional problems, an appropriate set of variables $H_y[n]$, $S_y[n]$, $H_z[n]$ and $S_z[n]$ would be added. Constraints for these variables are expressed as in Eqs. 10 and 11, and the variables would be added to the cost function in Eq. 12.

The simple-LP cost function of all ones simply tries to make individual gradient axes closer to their negative amplitude limits. However, the L1-norm cost function is preferable, as it tends to minimize the magnitude of both gradient current and voltage, which will improve heating characteristics of the waveform.

When L1-norm formulation is used, the piece-wise-linear constraints on gradient amplitude may be reduced by replacing the constraint on $G_x[n]$, $G_y[n]$, and $G_z[n]$ with equivalent constraints on $H_x[n]$, $H_y[n]$, and $H_z[n]$. Similarly, the voltage constraints may be replaced with constraints on $S_x[n]$, $S_y[n]$, and $S_z[n]$. Since all of the slack variables are constrained to be non-negative, only the gradient amplitude and voltage-limit constraints with positive coefficients are needed. This reduces the number of gradient amplitude constraints by a factor of $2^D$ where D is the number of gradient axes, and is the primary advantage of the L1-norm formulation compared to simple-LP formulation.

The L1-norm formulation uses 3ND variables, and approximately 2N(P+2D) constraints. For 2D or 3D problems, the number of constraints is often much smaller than that of the simple-LP formulation. Additionally, as described by Xu et al., L1-norm programming tends to find solutions where some or many of the variables are zero. This may be advantageous in gradient design, as solutions with lower gradient or slew duty cycle result in lower gradient heating.

Second-order cone programming (SOCP) (see Lobo et al., "Applications of second-order cone programming," Linear Algebra Appl. 1998; 284: 193-228) is a method that finds the solution x that minimizes a linear cost function $f^T x$ subject to the "second-order cone" constraint.

$$\|Ax+b\mu\|_2 \leq Cx+d \qquad (13).$$

First this constraint is a superset of the linear constraints in linear programming. Second, the cost function is linear, as with the simple-LP formulation described above, and is chosen in the same manner, as all ones.

The SOCP formulation of the gradient design problem begins with Eqs. 5-6. Although these constraints could be reduced by a factor of $2^D$ compared with the simple LP or L1-norm formulations, this has little effect on convergence time. The main advantage of the SOCP formulation is that the quadratic limits of Eqs. 3 and 4 result in a total of 2N−1 constraints, regardless of the number of gradient dimensions. Additionally, the SOCP formulation does not approximate the quadratic gradient limits, which sometimes results in slightly shorter duration solutions.

Because the time to find a solution increases with the number of constraints, it is useful to try to further reduce the number of constraints. Assuming that the slew-rate constraints are met, there will be gradient amplitude constraints near the endpoints that are redundant. Specifically, if the (minimum) distance from the start or end gradient to a linear or quadratic gradient constraint is $\Delta G$, then that constraint is redundant for at least a time $$\frac{L\Delta G}{\eta V_{max} + RG_{max}}.$$

The minimum-time gradient design problem is to find $N_{min}$, the minimum value of N for which a solution exists. Linear programming functions can be called sequentially with different values of N. We first assume that either $\vec{G}(0)=0$ or $\vec{G}(n\tau)=0$. If a solution exists for N, then $N_{min} \leq N$. Otherwise, $N_{min} \geq N$.

This suggests using a binary-search technique. This technique divides the unknown interval containing $N_{min}$ on each call. Begin with estimates of the upper and lower bounds $N_u$ and $N_l$ on N. First these are tested to ensure that they are in fact upper and lower bounds. If not, both bounds are raised or lowered accordingly and retested. Once $N_u$ and $N_l$ have been verified, N is set as close as possible to $N_l+v(N_u-N_l)$. Depending on whether or not a solution exists, either $N_u$ or $N_l$ is set to N, and the process is repeated. Use v=0.8 because an existing solution is found considerably more quickly than the lack of a solution using SOCP.

The above formulation has been implemented using Matlab 6.0 with functions from the Mathworks Optimization toolbox (Mathworks, Natick, Mass.). Specifically, use the linprog( ) function, which replaces the old lp( ) function in Matlab, as well as the socp( ) function described above. Matlab functions are available for general use.

First, compare the time required to solve the minimum time gradient-area-nulling problem using the simple-LP, L1-norm and SOCP methods. All tests used Matlab 6.0 on 1.8 GHz Athlon PCs running Linux. The binary search formulation was identical for all three methods, and the comparison was performed for 1D, 2D and 3D problems.

Generated were 1000 random gradient waveforms of random duration and the given dimension with endpoints within the magnitude constraint for the given solution method. A sample period of $\tau=20$ μs was used, which assumes a gradient amplifier bandwidth of less than 25 kHz. The gradient and zeroth moment of the gradient were then rewound to zero using the bisection method described above. Each step of the binary search method was solved using simple-LP, L1-norm or SOCP formulation. The times required to solve the rewinder problem for each waveform and each formulation method were recorded. In all cases a maximum gradient amplitude of 40 mT/m, and a constant-slew-rate model with 150 T/m/s maximum slew-rate were used. For 2D and 3D, the rewinders are limited by the quadratic constraints described above.

Figure 5A:
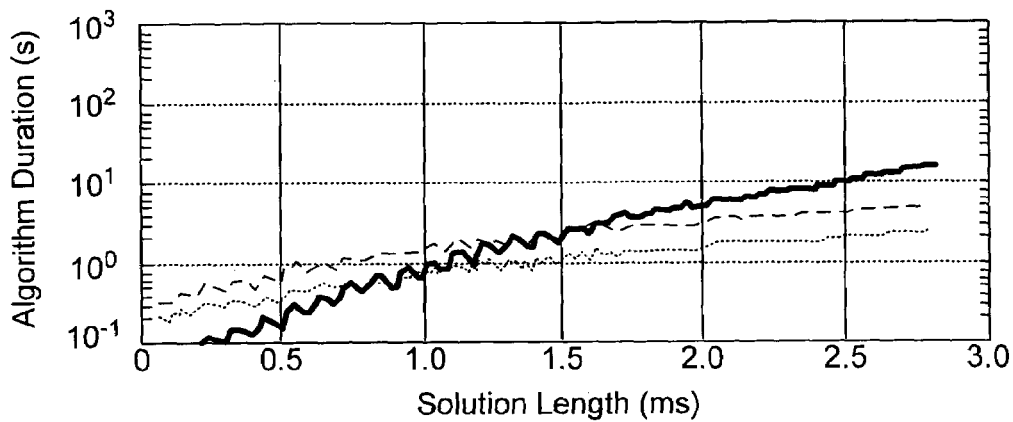
FIGS. 5a-5c illustrate comparison of speed of different formulations for 1D, 2D and 3D, respectively.
Figure 5B:
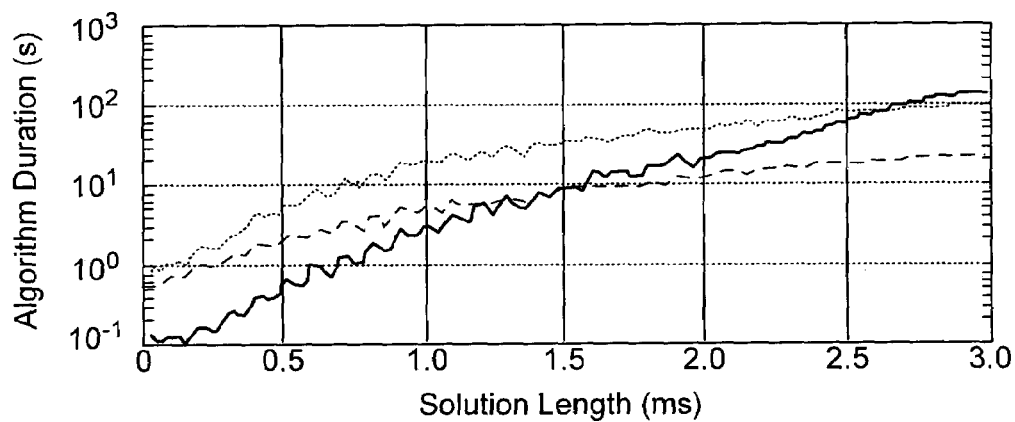
Figure 5C:
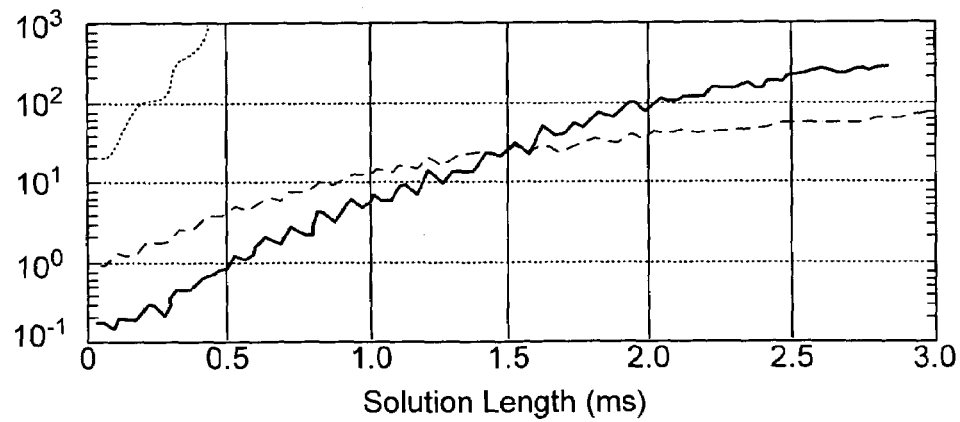
Figure 6A:
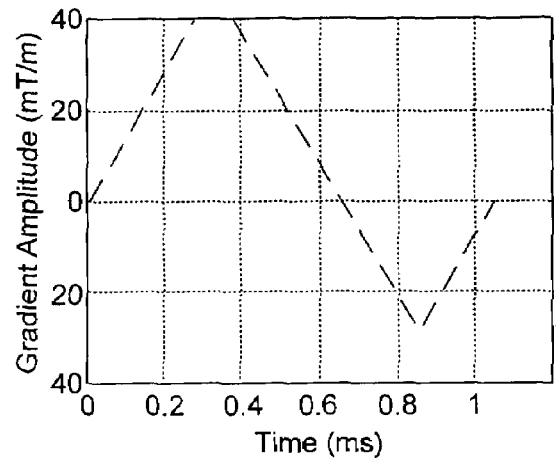
FIGS. 6a-6d illustrate first-moment-nulled gradient design.
Figure 6B:
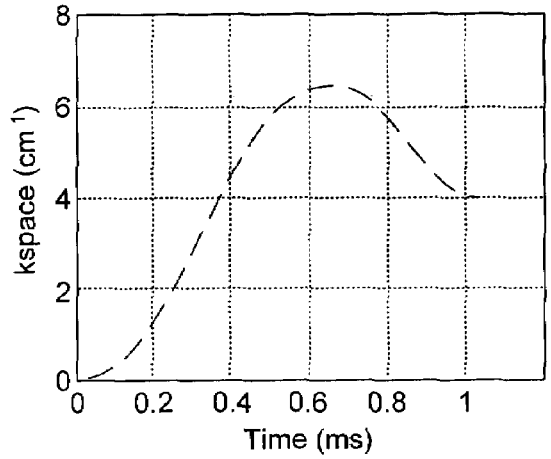
Figure 6C:
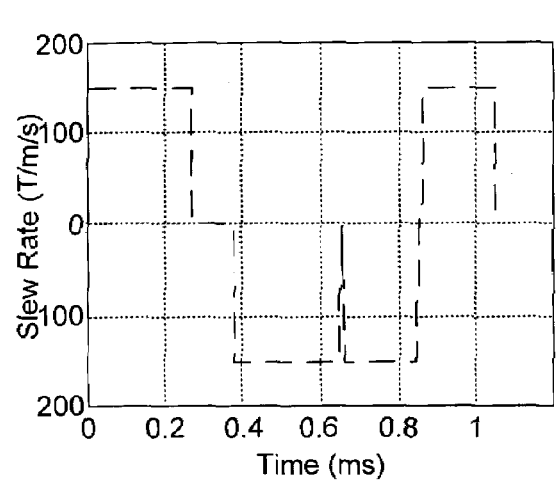
Figure 6D:
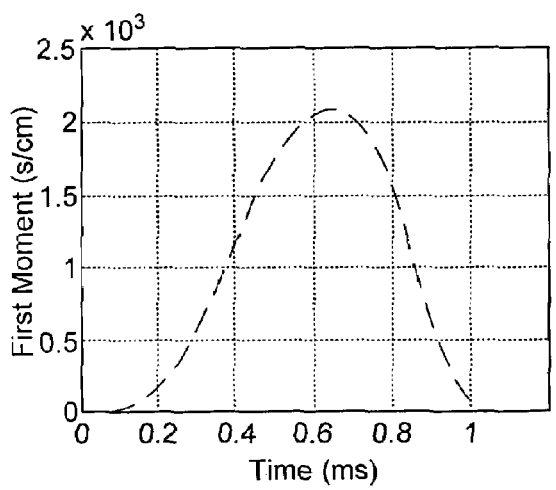

FIGS. 5a-5c compare convergence times for the three methods for 1D, 2D and 3D design problems. Shown are convergence time for 1D (a), 2D (b), and 3D (c) time-optimal gradient design using simple-LP (dotted line), L1-norm (dashed line) and SOCP (solid line). Although simple-LP formulation is the most efficient for 1D design problems, the L1-norm is significantly better for 2D and 3D problems. SOCP outperforms L1-norm in 2D and 3D problems, except when the solution turns out to be very long. Not surprisingly, convergence time increases with the solution length. SOCP formulation is fastest regardless of dimension for most practical waveforms (i.e., duration less than 1 ms), and is significantly faster than the other methods as the number of gradient dimensions increases to 2 or 3.

Presented now are several examples showing applications of linear programming for time optimal gradient design. We begin with 1D examples that show that linear programming produces the time-optimal waveforms. Next we show 2D examples, particularly for use in spiral imaging. Finally we show 3D examples for double-oblique or oblique spiral scans.

For a constant amplitude limit, constant-slew-rate limit gradient, the minimum time waveforms to produce a given zeroth, first and/or second moment are generally triangular or trapezoidal waveforms. However, calculation of the segments sometimes must be solved numerically.

A first example is the generation of a simple 1D moment-nulled phase-encoding gradient. The boundary constraints on the pulse waveform are $G_x[0]=G_x[N]=0$ and the desired k-space area and first-moments are $\Delta \vec{k} = k_{des}$ and $m_1=0$. This example sets $k_{des}=400$ m$^{-1}$, $G_{max}=40$ mT/m and maximum slew-rate $$\frac{\psi}{L} = 150 \text{ T/m/s}.$$

The resulting gradient waveform, k-space trajectory, slew-rate and first moment are shown in FIG. 6 which shows (a) first-moment-nulled gradient waveform, (b) corresponding k-space trajectory, (c) gradient slew-rate, and (d) gradient first-moment, all plotted as functions of time for Example A. The gradient waveform has a duration of 1.048 ms. The gradient is a bipolar combination of a trapezoidal lobe with a triangular lobe, as can reasonably be expected given amplitude- and slew-limited constraints in one dimension. Note that either the gradient amplitude limit or the slew-rate limit is always met, which should be the case for a minimum-time gradient in one dimension.

A second example is to design a minimum-time waveform that transitions between successive lines of an echo-planar imaging trajectory. For consistency, the same gradient and slew-limits, 20 mT/m and 200 T/m/s respectively, are used with the assumption that the gradients can be freely rotated to any oblique in-plane position. The EPI trajectory uses a 20 mT/m readout gradient, with 0.8 cm$^{-1}$ phase-encode area between lines. In our formulation, we specify $G_x[1]=-G_x[N]=20$ mT/m, $G_y[1]=G_y[N]=0$ mT/m, $\Delta k_x=0$ cm$^{-1}$ and $\Delta k_y=0.8$ cm$^{-1}$, $\tau-1$ μs.

Figure 7A:
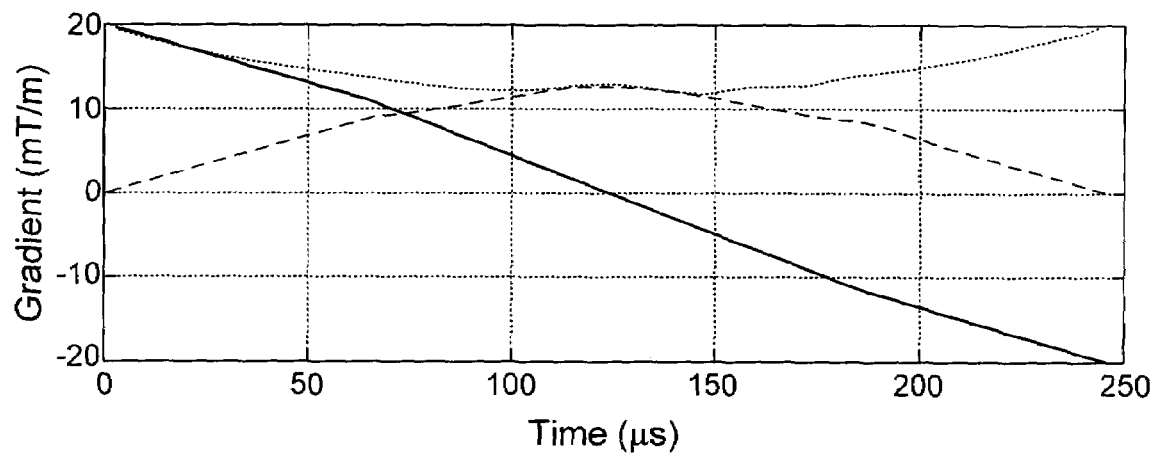
FIGS. 7a-7b illustrate echo-planar transition waveform design for gradient waveforms and slew-rates.
Figure 7B:
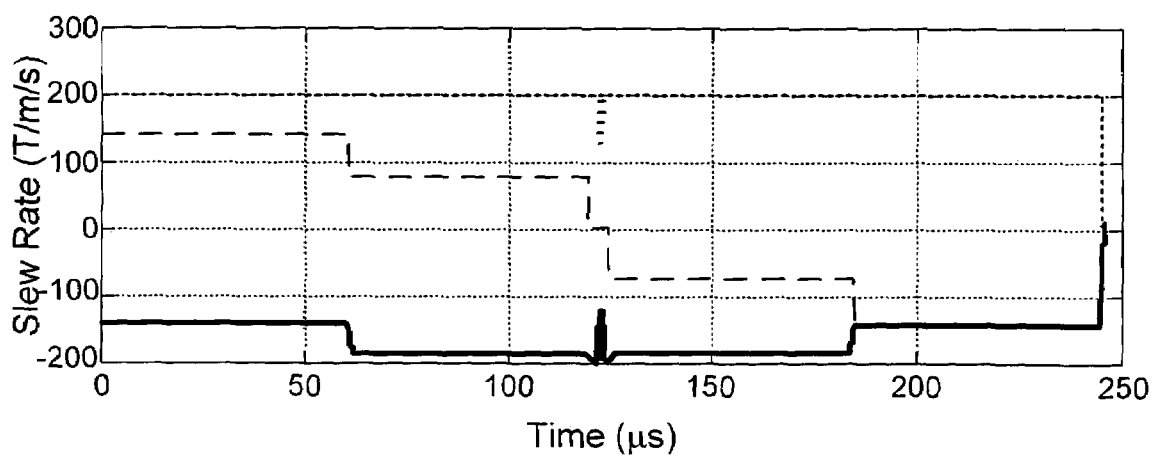
Figure 8A:
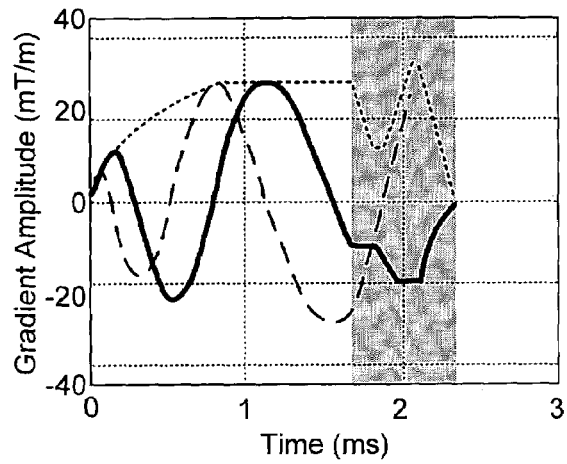
FIGS. 8a-8d illustrate spiral rewinder gradient design.
Figure 8B:
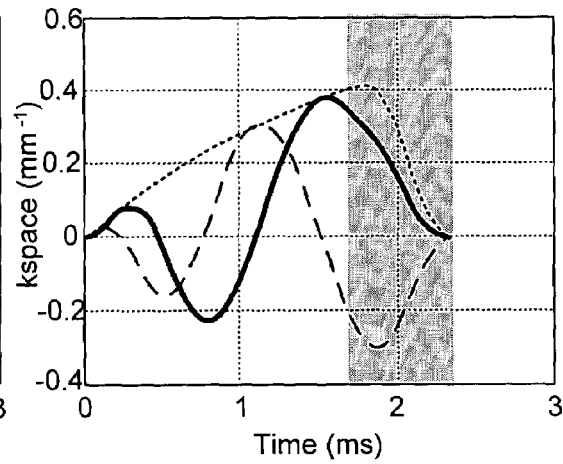
Figure 8C:
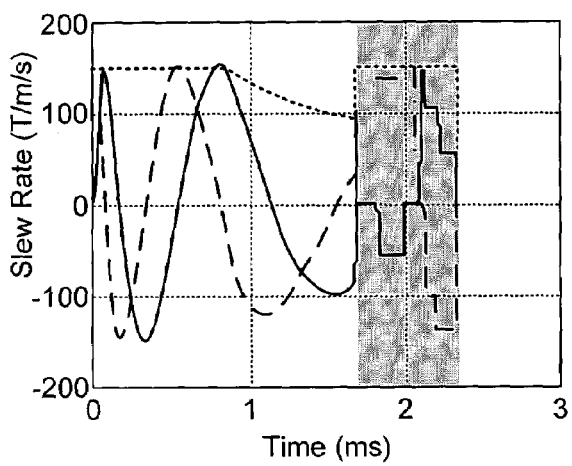
Figure 8D:
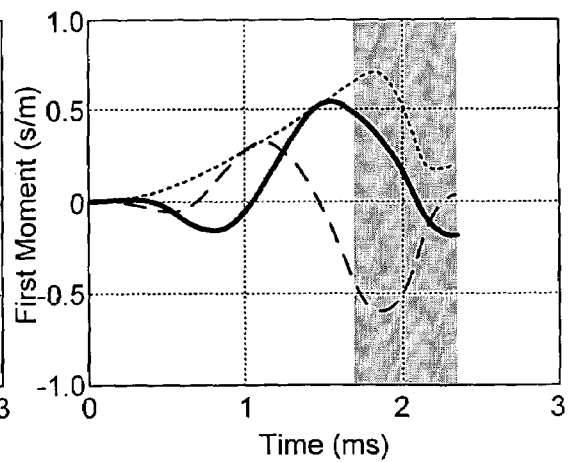

The result, shown in FIG. 7, has a total duration of 245 μs. In FIG. 7, gradient waveforms (a) and slew-rates (b) for an echo-planar readout/phase-encode transition are shown. Gradients and slew-rates are shown for the x-axis (solid line) y-axis (dashed line) and magnitude (dotted line). This method performs as well as the time-optimal method described in ref. (9).

The solutions with both methods look very similar, and the minor difference between them is most likely simply the way that the end-point constraint is formulated. Interestingly, this gradient is not zero at either endpoint. However, because of the symmetry of the problem, the bisection method of finding the minimum-time gradient still works.

Minimum gradient waveform design on one dimension can generally be solved exactly and analytically. However, two-dimensional design is not always simple. Consider spiral imaging, where interleaved spiral waveforms are played by rotating the waveform in the x-y gradient plane. For the trajectory to be played at arbitrary rotation angles, the gradient and slew-rate vector magnitudes must be within slew-rate constraints.

Spiral waveform design methods have been addressed previously. The spiral waveform can be rewound by separately rewinding each axis with both amplitude (current) and voltage limits set to $1/\sqrt{2}$ times the individual axis limits. This is adequate for applications where the spiral readout duration is long, but is not time-optimal. In cases such as spiral steady-state free precession imaging, it is desirable to rewind the first moment of the gradient as well. In this example, a time-optimal rewinder for spiral gradient waveforms as well as a rewinder for a first-moment-nulled spiral waveform are used.

For this example, a spiral waveform can be used similar to that used for SSFP imaging. The design assumes 60 spiral interleaves to achieve a resolution of 1.25 mm and a field-of-view of 20 cm with a readout duration of 2.7 ms.

The optimization goal is to rewind the gradient waveforms and zeroth moment vector simultaneously to zero as quickly as possible. The rewinder gradient vector initially equals the final gradient of the readout, and ends at zero in both dimensions. Combined with the constraint of rewinding the zeroth moment vector, this gives six equality constraints. FIG. 8 shows the spiral gradient waveform and rewinder characteristics. FIGS. 8a-8d illustrate gradient waveforms (a), k-space trajectory (b), slew-rates (c) and first moment (d) for a simple rewinder waveform (gray region) for a 2D-spiral imaging gradient. Each plot shows x (solid line) and y (dashed line) components, as well as the magnitude (dotted line). The k-space-only rewinder lasts for 0.66 ms, and has a significant residual first moment. All quantities reach zero at the end of the waveform. As with the 1D example, either the gradient magnitude or slew-rate magnitude limit is reached for the entire duration of the rewinder.

The spiral rewind problem can be repeated for the case where the first moments are also rewound at the end of the waveform. This adds a constraint in each axis for a total of eight equality constraints. The L1-norm solution is shown in FIGS. 9a-9d. Here are shown gradient waveforms (a), k-space trajectory (b), slew-rates (c) and first moment (d) for an $m_1$-nulled rewinder waveform (gray region) for a 2D-spiral imaging gradient. Each plot shows x (solid line) and y (dashed line) components, as well as the magnitude (dotted line). The $m_1$-nulled rewinder lasts for 1.23 ms, and rewinds the gradient, k-space location and the first moment. For nulling of the first moments, the minimum-time waveform is significantly increased, from 0.78 ms to 1.38 ms. If the two axes were rewound separately (as is commonly performed), each using 70% of the maximum power, the duration would be closer to 1.8 ms. In rapid imaging sequences such as SSFP, 0.4 ms is a significant time reduction, i.e., 10% of the repetition time or 25% of the data acquisition time.

Figure 10A:
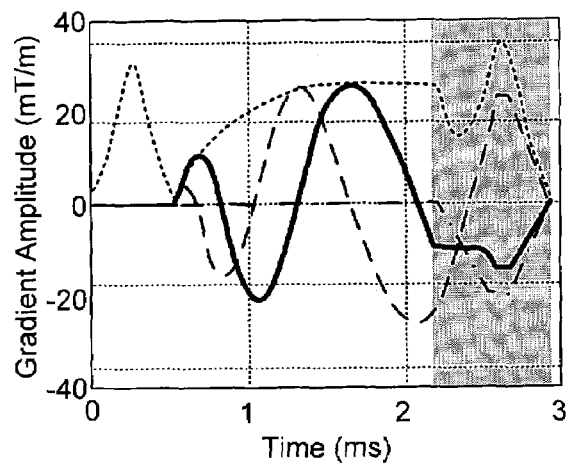
FIGS. 10a-10c illustrate "stack-of-spiral" rewinder gradient design.
Figure 10B:
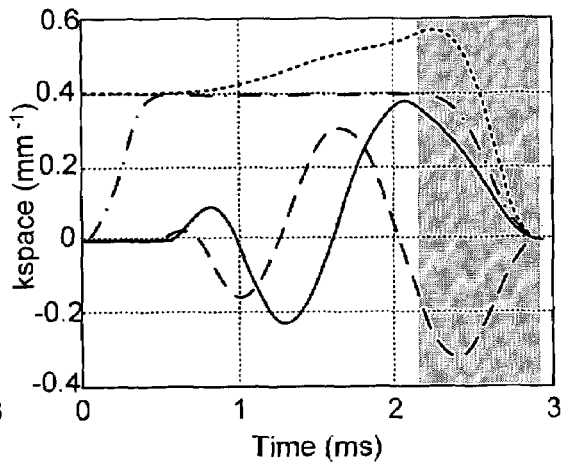
Figure 10C:
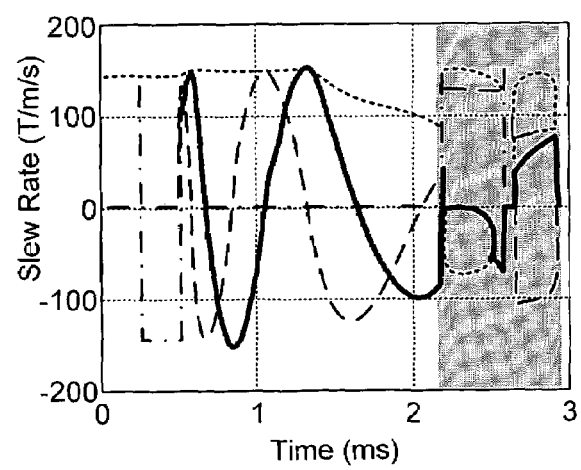

There are cases where the gradient vector must be rotated freely in three dimensions, such as double-oblique scans or oblique-plane spiral scans. The 3D "stack of spirals" example in FIGS. 10a-10c pertains to the latter. Shown are gradient waveforms (a), k-space trajectory (b) and slew-rates (c) for a 3D rewinder waveform (gray region) for a "stack-of-spirals" imaging gradient. Each plot shows x (solid line), y (dashed line) and z (dash-dot line) components, as well as the magnitude (dotted line). The rewinder gradient lasts for 0.74 ms. For gradient-spoiled acquisition, it is desirable to play a gradient spoiler on the z-axis following the spiral readout. To minimize the overall time, this spoiler should be played out simultaneously with the spiral rewinder.

The problem is formulated the same way as that of the simple spiral-rewinder in Example B with the additional constraints that in the z-axis, we specify $G_x[1]=G_x[N]=0$ and a desired k-space area.

The LP formulation is useful for optimizing oblique gradient design. Gradient design is simplest when the three gradient axes may be designed independently of each other, that is when each "logical" gradient axis corresponds exactly to one "physical" gradient axis. This non-oblique case corresponds to the 3D LP formulation where the gradient constraints are simply $|G_x[n]| \leq G_{max}$, $|G_y[n]| \leq G_{max}$, and $|G_z[n]| \leq G_{max}$.

Figure 11:
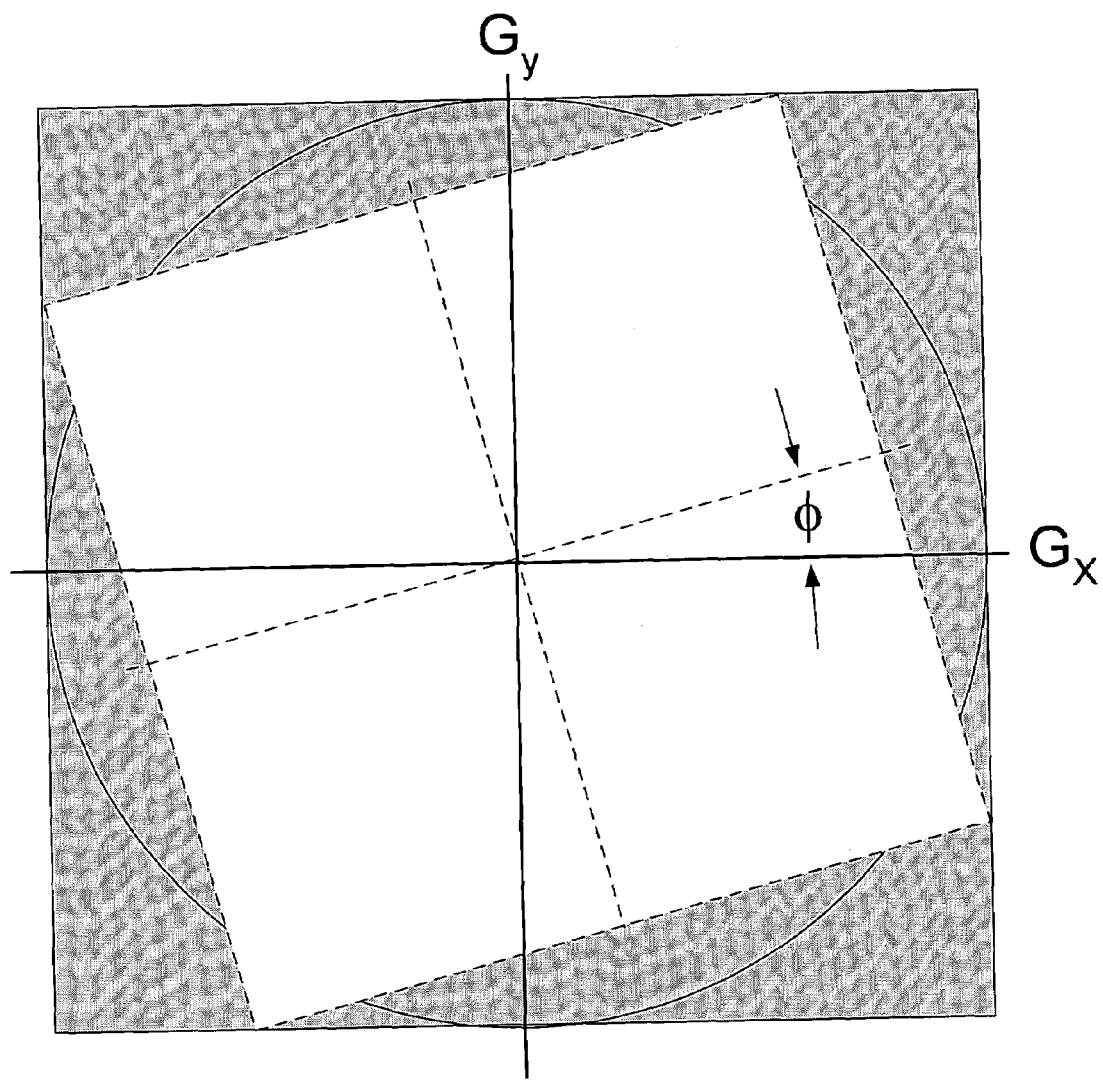
FIG. 11 illustrates gradient power for different oblique gradient angles.

Gradient limits can be reset for any rotation angle by scaling the logical gradient limit by $(\cos \phi + \sin \phi)^{-1}$, where $\phi$ is the angle between major logical and physical axes. As shown in FIG. 11, this ensures that the gradient vector always lies within the large gray square. However, this is obviously inefficient in that a significant amount of gradient power is not used. FIG. 11 illustrates gradient amplitude usage for different oblique-scan strategies. The dark gray square represents all usable gradient amplitude, and the circle represents the quadratically-constrained amplitude if the gradient is designed to be freely-rotatable. If gradients are designed completely independently, then the amplitude limits on each axis must be reduced so that the worst-case gradient still lies within the dark gray square. This is shown for a rotation angle of θ=15° (dashed lines). With constraints tailored to the specific oblique angle, all gradient power is available for any rotation angle.

The LP formulation is very adaptable, as the physical constraints can simply be rotated to the logical coordinate system. This means that for oblique gradient design all available gradient power is always used.

Consider the echo-planar transition of example B where the logical and physical gradients are rotated by φ=0° and φ=30°. Here the design is gradient for each specific oblique position. The gradient amplitude constraints are $$\cos \phi G_x[n] - \sin \phi G_y[n] \leq G_{max}$$

$$-\cos \phi G_x[n] + \sin \phi G_y[n] \leq G_{max}$$

$$\sin \phi G_x[n] + \cos \phi G_y[n] \leq G_{max}$$

$$-\sin \phi G_x[n] - \cos \phi G_y[n] \leq G_{max} \quad (14)$$

where φ is the angle of rotation between logical and physical coordinate systems. The slew-rate constraints are $$\cos \phi(\alpha G_x[n] + \beta G_x[n+1]) - \sin \phi(\alpha G_y[n] + \beta G_y[n+1]) \leq \psi$$

$$-\cos \phi(\alpha G_x[n] + \beta G_x[n+1]) + \sin \phi(\alpha G_y[n] + \beta G_y[n+1]) \leq \psi$$

$$\sin \phi(\alpha G_x[n] + \beta G_x[n+1]) + \cos \phi(\alpha G_y[n] + \beta G_y[n+1]) \leq \psi$$

$$-\sin \phi(\alpha G_x[n] + \beta G_x[n+1]) - \cos \phi(\alpha G_y[n] + \beta G_y[n+1]) \leq \psi$$

Figure 12A:
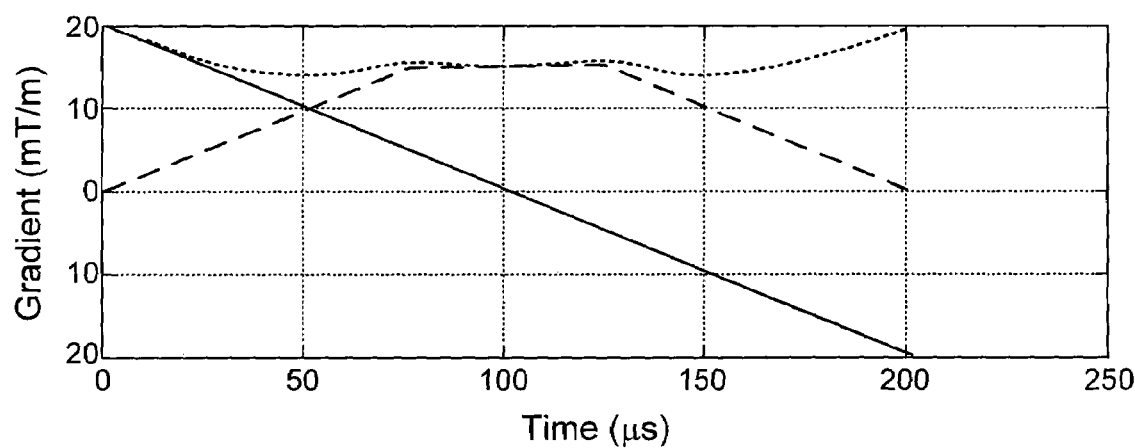
FIGS. 12a-12b illustrate on-axis echo-planar transition waveform design.
Figure 12B:
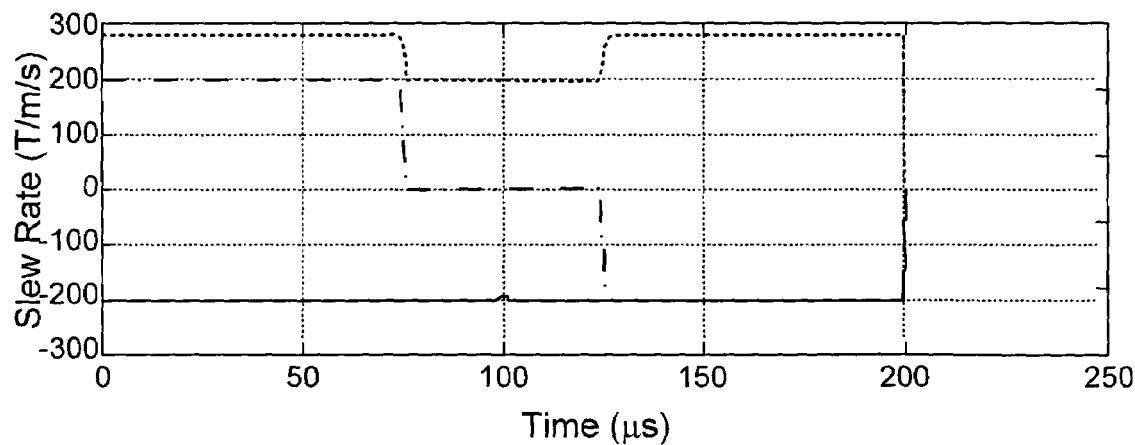
Figure 13A:
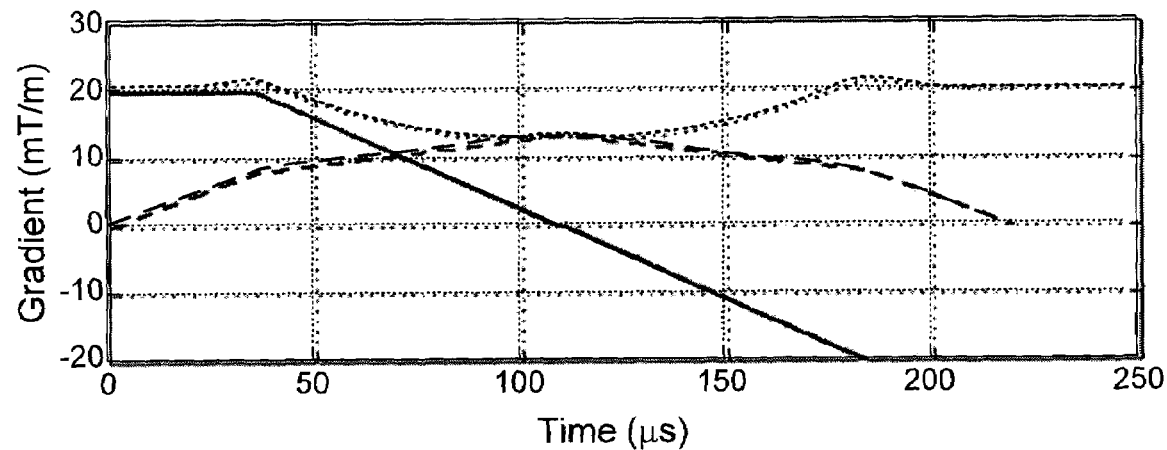
FIGS. 13a-13b illustrate off-axis echo-planar transition waveform design.
Figure 13B:
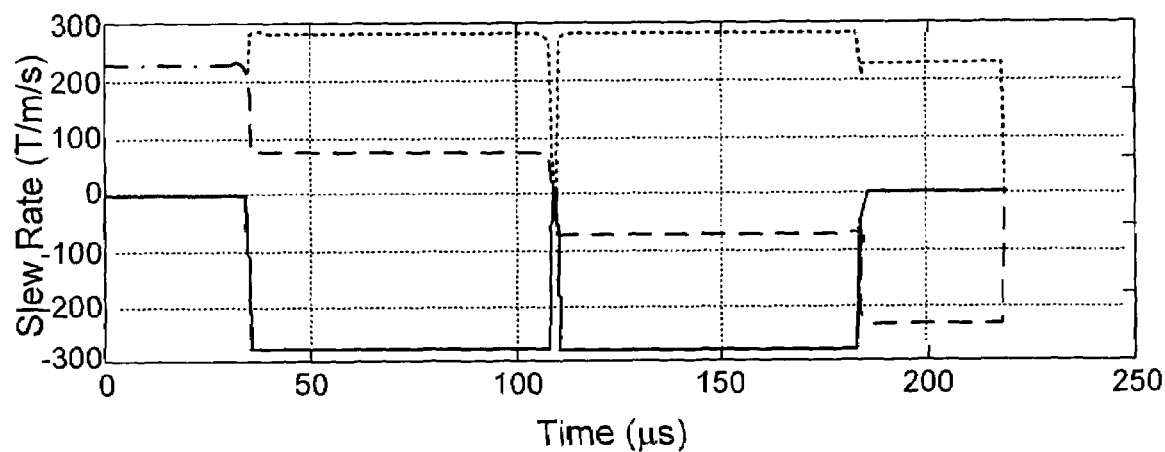

FIGS. 12 and 13 show the resulting waveforms. Both waveforms are faster than that shown in FIG. 7, as more gradient power is available, both for amplitude and slew-rate. The off-axis case results in a longer waveform, because slewing in two logical axes must be performed by one physical axis.

The gradient waveform design can also include constraints to avoid overheating and to limit maximum thresholds. The gradient amplifier, wires, and coils have several heating constraints. These can be expressed as functions of the gradient waveforms and the derivatives of the waveforms. Often these constraints are binding in the operation of the scanner. Hence it would be important to be able to constrain the heating in the waveform design algorithm. Fortunately it is possible to include constraints on the gradient waveform and its derivative in the methods disclosed herein.

The heat dissipated in the coil itself is $$E_{coil} = \int_0^T I^2 R_{coil} dt \quad (16)$$

where $R_{coil}$ is a constant, and I is proportional to the gradient waveform, G(t).

Using the SOCP formulation, the waveforms G(t) for each axis are approximated by a discrete-time waveform $G_i$, where i=1 . . . N. Using this, the quadratic constraint can be expressed directly and added to the other constraints in the problem, as $$\sqrt{\sum_{i=1}^{N} TG_i^2} < \sqrt{\eta E_{max}} \quad (17)$$

where $E_{max}$ is the maximum heat that can be dissipated in the coil for a given time duration, η is the coil efficiency (G/cm/A), and T is the gradient sampling step. Alternatively, instead of constraining the heat, the heat can be minimized by first adding a slack variable, E, in the SOCP formulation as follows:

$$\sqrt{\sum_{i=1}^{N} TG_i^2} < E. \quad (18)$$

Then E can be minimized in the SOCP cost function directly.

Amplifier heating models vary from system to system, but generally are of the following form:

$$E_{amp} = \int_0^T I^2 R_{sat} dt + \int_0^T |I| V_{sat} dt + V_{pwm} |I| PWM(I). \quad (19)$$

The first two terms of this equation can be constrained or minimized by adding slack variables in the SOCP formulation. The first term uses one slack variable, $E_1$, as $$\sum_{i=1}^{N} TR_{sat} \frac{G_i^2}{\eta^2} < E_1. \quad (20)$$

The second term first defines N variables, $P_i$, as $$\sqrt{\frac{V_{sat}^2 G_i^2}{\eta^2}} < P_i. \quad (21)$$

Then, neglecting the third term, $E_{amp}$ can be constrained or minimized by constraining or minimizing the sum:

$$J = \sum_{i=1}^{N} TP_i + E_1. \quad (22)$$

The time varying magnetic field of a gradient amplifier has been known to induce electric fields of sufficient magnitude to excite nerves. This is known as magnetostimulation or peripheral nerve stimulation (PNS). Stimulation is a function of gradient amplitude and the derivative of the gradient amplitude. The FDA does not advise MRI manufacturers to operate the gradient amplifiers above stimulation thresholds. Hence, it would be a contribution to the state of the art of gradient waveform design to be able to include maximum stimulation thresholds in the waveform algorithm. Average population studies have determined stimulation thresholds that are a linear combination of G(t) and dG/dt(t).

Figure 14:
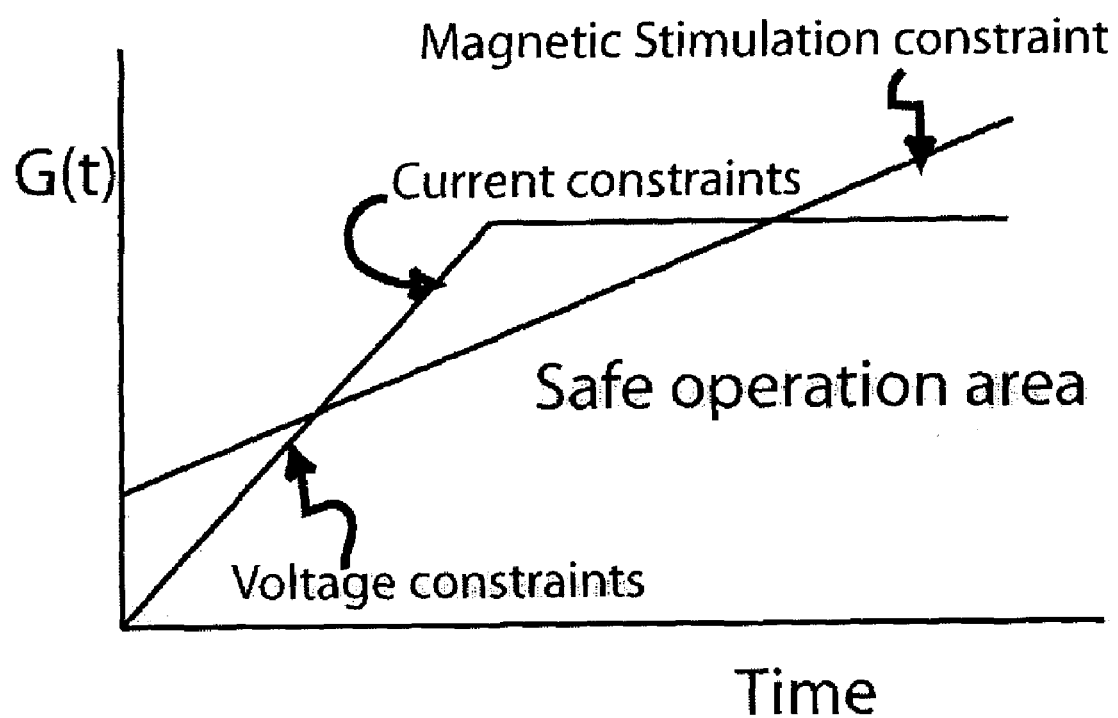
FIG. 14 is a graph illustrating voltage and current constraints and magnetic stimulation constraints for safe operation of a gradient amplifier.

Mathematically, this stimulation limit can be written as $$\left| \alpha G(t) + \beta \frac{dG}{dt} \right| < A_{stim} \quad (23)$$

where G(t) is the gradient and dG/dt is the first derivative of the gradient. The stimulation threshold, $A_{stim}$, is determined experimentally, and may vary from patient to patient. Given $A_{stim}$, the stimulation limits can be imposed on the individual or combined gradient axes in the exact same way as the amplifier voltage limits. FIG. 14 illustrates the voltage and current constraints and magnetic stimulation constraints for safe operation of a gradient amplifier.

The design of many minimum-time gradient waveforms can be expressed as a constrained optimization problem. With some manipulation, the problem can be posed as a standard linear programming (LP) problem, for which many efficient solving methods have been developed. The formulation described solves minimum-time gradient problems where the initial and final gradient values and desired moments are specified, and where the gradient either starts or ends at zero.

Proof of time-optimality is an interesting question. For 1D cases, this can be done, and results indicate this algorithm produces the minimum-time solution. For more complex cases where there is not an analytic solution, it is not possible to prove time-optimality of the solution. Based on the principles of convex optimization techniques, it is assumed that the solutions are time-optimal. Additionally, the simple LP formulation and L1-norm formulation always give the same duration gradient.

The minimum-time gradient problem, as expressed above, is a series of feasibility problems using different length solution vectors. Shown are three different problem formulations. First, the problem can be solved simply as a standard LP problem, using $G_x[n]$, $G_y[n]$, and $G_z[n]$ variables representing the gradient on each axis. Second, the L1-norm formulation adds additional slack variables, $H_x[n]$, $H_y[n]$, and $H_z[n]$, representing the gradient magnitudes, and $S_x[n]$, $S_y[n]$, and $S_z[n]$ representing the voltage magnitude to further reduce the number of constraints. The L1-norm formulation also allows a more physically-meaningful cost function to be expressed. Third, the second-order cone programming (SOCP) formulation uses $G_x[n]$, $G_y[n]$, and $G_z[n]$ variables and quadratic constraints on both gradient amplitude and gradient voltage.

The simple LP formulation is advantageous compared to L1-norm only for 1D problems. For 2D or 3D problems for which the solutions consist of 75 or fewer time samples (1.5 ms with ΔT=20 µs), the SOCP formulation is the fastest formulation. Given that the SOCP formulation also uses the available gradient limits slightly more efficiently than either simple LP or L1-norm formulation, it is clearly the best option. However, if SOCP software is not available, the L1-norm formulation also performs very well for 2D or 3D problems.

Minimum time, multi-dimensional gradient design is an increasingly important part of designing MR imaging sequences. The invention provides a method that can deliver the time-optimal gradients given a variety of constraints such as amplitude, slew-rate, end points or gradient moments. The invention uses standard linear programming tools, which are robust and efficient.

While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A method of rapid magnetic resonance imaging using constrained optimization comprising the steps of:
    A) applying a magnetic gradient to an object, comprising the steps of:
        a) selecting a number N of discrete-time waveforms with a sampling period, τ, and time T=Nτ,
        b) expressing constraints as equations,
        c) identifying if a solution exists for T, and if not, increasing T until a solution exists,
        d) decreasing T to find a shortest solution, and
        e) solving the equations to identify said shortest solution, utilizing linear programming to identify said shortest solution, wherein the linear programming finds the vector x that minimizes a cost function $f^T x$ subject to the constraint Ax=<b, where matrix A and vector b are formed by combining all of the linear constraint equations for an amplifier and pulse sequence constraints, wherein said shortest solution is used for generation of said magnetic gradient;
    B) detecting imaging signals; and
    C) providing an image based on the detected image signals.

2. The method as defined by claim 1 wherein steps c), d), and e) utilize L1-norm formulation.

3. The method as defined by claim 2 wherein the gradient is one dimensional.

4. The method as defined by claim 2 wherein the gradient is two dimensional.

5. The method as defined by claim 2 wherein the gradient is three dimensional.

6. The method as defined by claim 2 wherein in step a) the gradient amplifier has current and voltage limits ($I_{max}$ and $V_{max}$) that result in the following limits on G(p):

$$|G(t)| \leq \eta I_{max} \text{ and } \left| L\frac{d}{dt}G(t) + RG(t) \right| \leq \eta V_{max}$$

where L, R, and 1 are the gradient coil inductance, resistance, and efficiency.

7. A method of rapid magnetic resonance imaging using constrained optimization comprising the steps of:
    A) applying a magnetic gradient to an object, comprising the steps of:
        a) selecting a number N of discrete-time waveforms with a sampling period, τ, and time T=Nτ,
        b) expressing constraints as equations,
        c) identifying if a solution exists for T, and if not, increasing T until a solution exists, d) decreasing T to find a shortest solution, and
e) solving the equations to identify said shortest solution, wherein steps c), d), and e) include adding slack variables to the optimization, wherein said shortest solution is used for generation of said magnetic gradient;

B) detecting imaging signals; and

C) providing an image based on the detected image signals.

8. The method as defined by claim 7 wherein step e) solves for gradient Gx(n) and a set of variables $H_x(n)$ that converge to |Gx(n)| and a set of variables $S_x(n)$ that converge to |αGx(n)+βGx(n+1)|, wherein a sequence number n=1 ... N, $$\alpha = R - \frac{L}{\tau}, \text{ and } \beta = \frac{L}{\tau},$$

where R is a gradient coil resistance and L is a gradient coil inductance.

9. The method as defined by claim 8 wherein the slack variables are forced to converge by adding linear gradient constraints:

$-H_x[n]+G_x[n] \leq 0$ $-H_x[n]-G_x[n] \leq 0$ and slew-rates constraints:

$S_x[n]+\alpha G_x[n]+\beta G_x[n+1] \leq 0$ $S_x[n]-\alpha G_x[n]-\beta G_x[n+1] \leq 0$ whereby the constraints force the Hx(n) and Sx(n) variables to approach an appropriate absolute value when combined with minimization of the following pulse function:

$$J(S_x[n], H_x[n]) = \sum_{n=1}^{N} (H_x[n] + S_x[n]).$$

10. The method as defined by claim 7 wherein steps c), d) and e) use a binary-search to minimize time in identifying the minimum value of n which provides a solution.

11. The method as defined by claim 10 wherein the gradient is one dimensional.

12. The method as defined by claim 10 wherein the gradient is two dimensional.

13. The method as defined by claim 10 wherein the gradient is three dimensional.

14. The method as defined by claim 10 wherein in step a) the gradient amplifier has current and voltage limits ($I_{max}$ and $V_{max}$) that result in the following limits on G(p):

$$|G(t)| \leq \eta I_{max} \text{ and } \left|L\frac{d}{dt}G(t) + RG(t)\right| \leq \eta V_{max}$$

where L, R, and η are the gradient coil inductance, resistance, and efficiency.

15. The method as defined by claim 7 wherein the gradient is one dimensional.

16. The method as defined by claim 7 wherein the gradient is two dimensional.

17. The method as defined by claim 7 wherein the gradient is three dimensional.

18. The method as defined by claim 7 wherein in step a) the gradient amplifier has current and voltage limits ($I_{max}$ and $V_{max}$) that result in the following limits on G(p):

$$|G(t)| \leq \eta I_{max} \text{ and } \left|L\frac{d}{dt}G(t) + RG(t)\right| \leq \eta V_{max}$$

where L, R, and η are the gradient coil inductance, resistance, and efficiency.

19. The method as defined by claim 7 and further including:
f) establishing physical constraints of a gradient amplifier and a gradient coil.

20. The method as defined by claim 19 and further including:
g) establishing beginning and end gradient boundary constraints and fixed area for one or more gradient moments.

21. The method as defined by claim 7 and further including:
f) establishing beginning and end gradient boundary constraints and fixed area for one or more gradient moments.

22. The method as defined by claim 7 wherein step b) includes gradient heating constraints.

23. The method as defined by claim 22 wherein step b) includes gradient magnetostimulation constraints.

24. The method as defined by claim 7 wherein step b) includes gradient magnetostimulation constraints.

25. A method of rapid magnetic resonance imaging using constrained optimization comprising the steps of:
A) applying a magnetic gradient to an object, comprising the steps of:
a) selecting a number N of discrete-time waveforms with a sampling period, τ, and time T=Nτ,
b) expressing constraints as equations,
c) identifying if a solution exists for T, and if not, increasing T until a solution exists,
d) decreasing T to find a shortest solution, and
e) solving the equations to identify said shortest solution, utilizing a second-order cone programming (SOCP) to find said shortest solution x that minimizes a linear pulse function $f^T X$ subject to a second order cone constraint $\|Ax+b\|_2 \leq Cx+d$ which is a superset of the linear constraints in linear programming where matrices A and B and vectors b and d are formed by combining all linear constraint equations for amplifier and pulse sequence constraints, wherein said shortest solution is used for generation of said magnetic gradient;

B) detecting imaging signals; and

C) providing an image based on the detected image signals.

* * * * *